United States Patent [19]

Celler et al.

[11] Patent Number: 4,581,814
[45] Date of Patent: Apr. 15, 1986

[54] PROCESS FOR FABRICATING DIELECTRICALLY ISOLATED DEVICES UTILIZING HEATING OF THE POLYCRYSTALLINE SUPPORT LAYER TO PREVENT SUBSTRATE DEFORMATION

[75] Inventors: George K. Celler, New Providence, N.J.; Pradip K. Roy, Wyomissing Hills; Donald G. Schimmel, Reading, both of Pa.; Lee E. Trimble, Hillsborough, N.J.

[73] Assignee: AT&T Bell Laboratories, Murray Hill, N.J.

[21] Appl. No.: 681,270

[22] Filed: Dec. 13, 1984

[51] Int. Cl.⁴ .................. H01L 21/20; H01L 21/76
[52] U.S. Cl. .................. 29/576 W; 29/576 T; 29/580; 148/1.5; 148/174; 148/DIG. 85; 148/DIG. 86; 148/DIG. 97; 148/DIG. 122; 148/DIG. 123; 357/49
[58] Field of Search ............... 29/576 W, 580, 576 T; 148/1.5, 174, DIG. 85, DIG. 86, DIG. 97, DIG. 122, DIG. 123; 357/49, 59

[56] References Cited

U.S. PATENT DOCUMENTS 3,862,852  1/1975  Kamins ..................... 148/174 X
4,017,341  4/1977  Suzuki et al. ................ 148/174
4,079,506  3/1978  Suzuki et al. ............. 148/DIG. 97
4,173,674  11/1979  Mimura et al. ............. 29/576 W
4,309,225  1/1982  Fan et al. ..................... 148/1.5
4,479,846  10/1984  Smith et al. ................ 156/612 X
4,494,303  1/1985  Celler et al. ............... 29/576 W

OTHER PUBLICATIONS

Suzuki et al., "Deformation of Polycrystalline-Silicon . . . Oxide Covered . . . " J. Electrochem. Soc., vol. 124, No. 11, Nov. 1977, pp. 1776-1780.
Suzuki et al., "Deformation in Dielectric-Isolated . . . Support Structure" J. Electrochem. Soc., vol. 127, No. 7, Jul. 1980, pp. 1537-1542.
Ouwens et al., "Recrystallization . . . in Polycrystalline Silicon" Appl. Phys. Letters, vol. 25, No. 10, May 15, 1975, pp. 569-571.

Primary Examiner—William G. Saba
Attorney, Agent, or Firm—Bruce S. Schneider

[57] ABSTRACT

The efficacy of dielectrically isolated device formation on a substrate is substantially enhanced through a specific set of processing steps. In particular, before silicon oxide regions, e.g., gate oxide regions, are produced, bulk polycrystalline areas are heat treated to substantially increase their polycrystalline silicon grain size.

6 Claims, 14 Drawing Figures

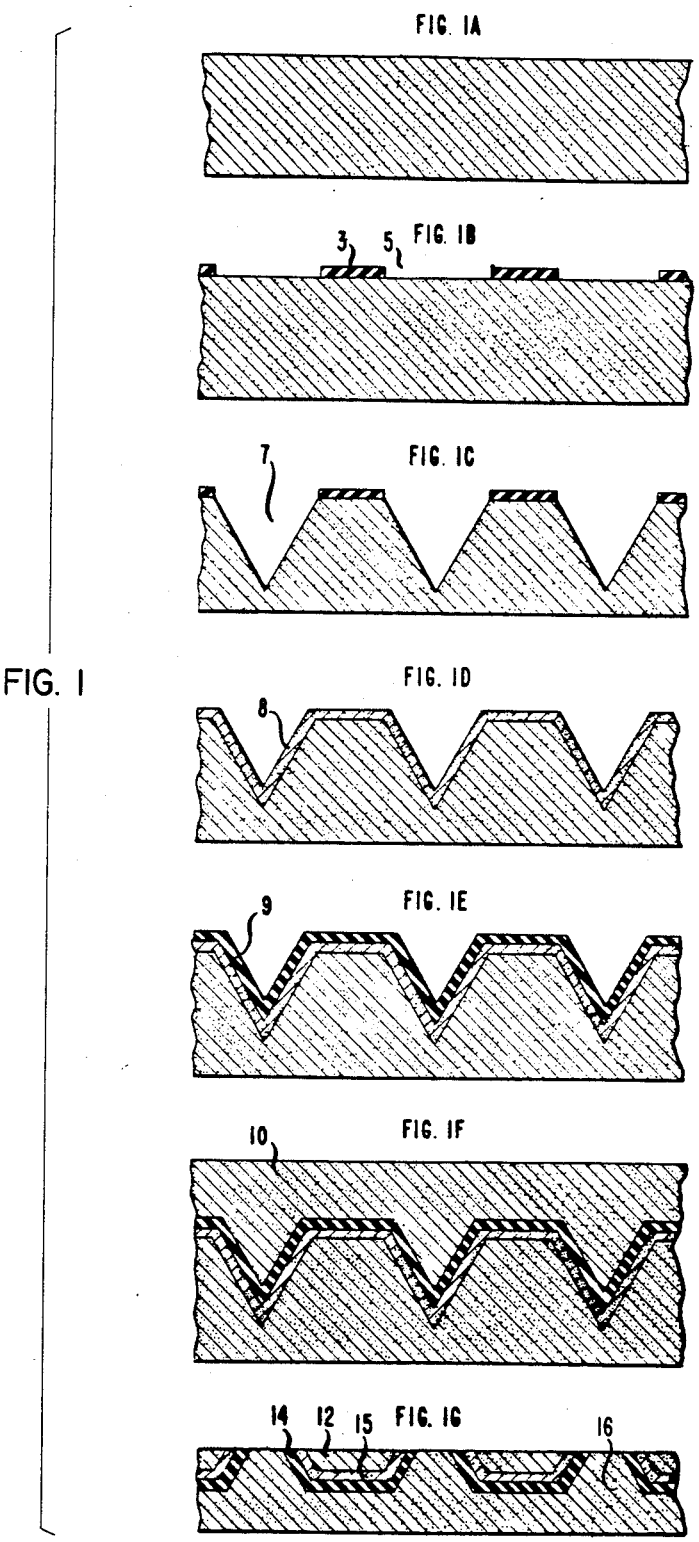

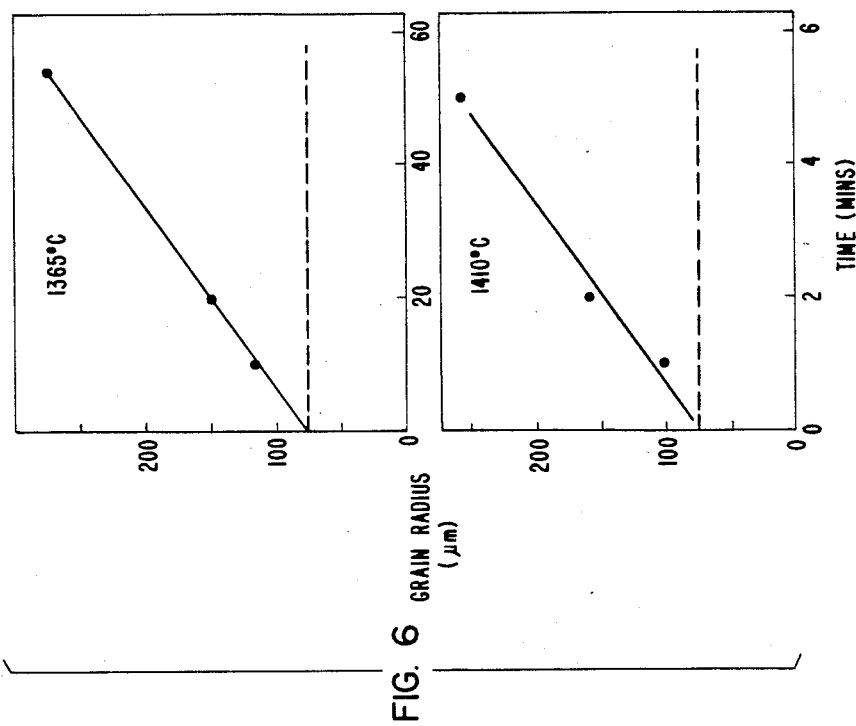
FIG. 6
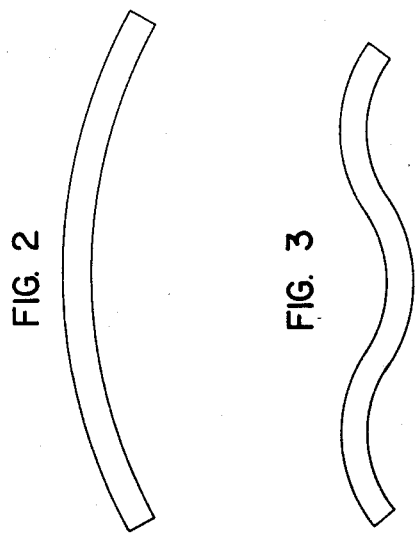
FIG. 2
FIG. 3
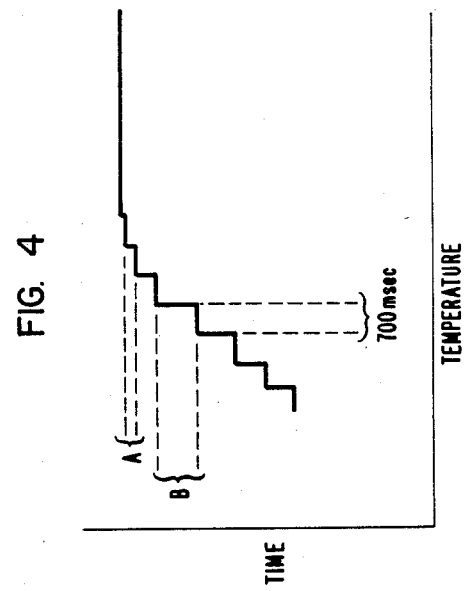
FIG. 4

FIG. 5
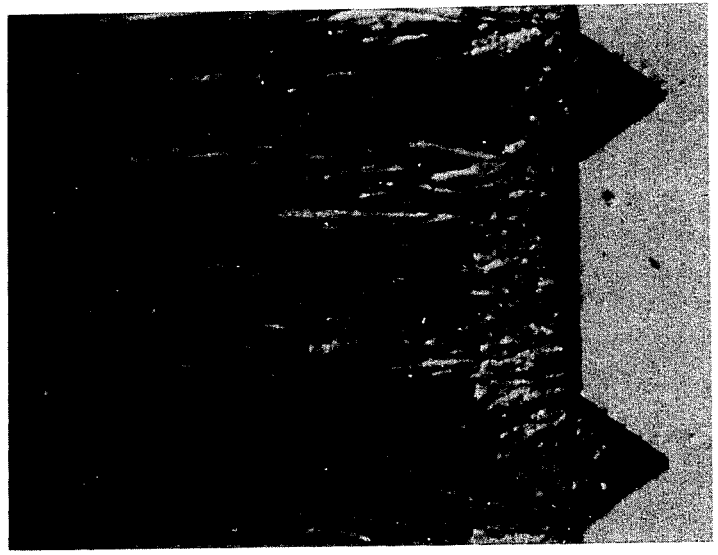
EXAMPLE II
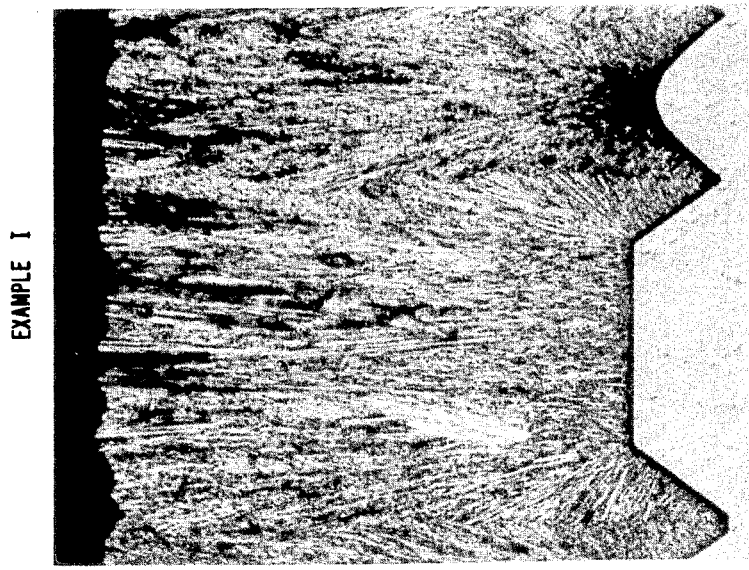
EXAMPLE I
200 μm

PROCESS FOR FABRICATING DIELECTRICALLY ISOLATED DEVICES UTILIZING HEATING OF THE POLYCRYSTALLINE SUPPORT LAYER TO PREVENT SUBSTRATE DEFORMATION

BACKGROUND OF THE INVENTION

1. Field of the Invention

This invention relates to electronic device fabrication and, more particularly, to device fabrication involving silicon.

2. Art Background

In most electronic components, such as integrated circuits, lateral separation is produced between regions of essentially single crystal silicon, i.e., silicon having less than a total of $10^8$ cm$^{-2}$ defects, e.g., linear and planar defects such as dislocations or stacking faults, respectively. This separation is accomplished by interposing between the single crystal silicon regions a region of electrically insulating material having a thickness approximately equal to the depth of the active regions of the single crystal materials being separated. (The active region is that portion of the single crystal silicon which is modified to contain electronic device structures. The active region is typically 1 $\mu$m thick for nominal voltage devices.) Alternatively, a p-n barrier separates the device regions. In this manner, transistors or other devices formed in one single crystal region, i.e., one active region, are electrically isolated and are prevented from interacting with devices in a second active region.

However, for some significant applications, the use of lateral isolation alone is not sufficient. For example, in some instances, the voltage employed in operation is often large enough to cause interaction between separate active regions. This interaction occurs by the penetration of charge carriers below one active region through the underlying substrate, across the substrate under the lateral isolation region, and up into the second active region. To prevent such undesirable electrical interaction between two active regions, vertical electrical isolation, in addition to lateral isolation, is employed. Vertical isolation is provided by underlying some, or most commonly all, of the single crystal silicon regions with a region of electrically insulating material. By this expedient, interaction between active regions even at high voltages is avoided.

Vertical isolation is also advantageously used in devices operating at nominal voltages where enhanced reliability is desirable. The additional insulating material that provides vertical isolation also prevents electron hole pairs formed in the underlying substrate by thermal processes or by ionizing radiation from migrating to an active region and, therefore, introducing errors in the processing of information by the electronic devices in this region. Additionally, the vertical isolation reduces capacitance and thus allows faster device operation.

Various processes have been employed to produce a component having both lateral and vertical isolation. For example, a dielectric isolation process is described by K. E. Bean and W. R. Runyan, in *Journal of the Electrochemical Society*, 124(1), 5C (1977). This process involves the use of a silicon substrate having a very low defect density. The silicon substrate is coated with an insulating material, such as silicon oxide, 3 in FIG. 1, and holes, 5, are formed in the oxide by conventional techniques, e.g., photolithography followed by chemical etching. Grooves, 7, are then etched in the exposed portions of the silicon underlying the holes in the dielectric material. Optionally, a region of N+ silicon, 8, is produced on grooves, 7. The N+ silicon is, in turn, coated with an insulator, 9, such as silicon oxide. The insulator is once again, in turn, coated with a layer of polycrystalline silicon, 10. The structure produced is denominated 1F in FIG. 1. The entire structure is then inverted; the silicon substrate is ground off until the structure shown at 1G is obtained. In this structure, the remaining high-quality silicon is denoted by 12, insulating layers are indicated by 14 and 15, and polycrystalline silicon is indicated by 16. Thus, the final structure has single crystal silicon, 12, on an electrically insulating material.

As the fabrication steps are performed in the process of FIG. 1, the substrate undergoes a variety of deformations. Generally, either (1) a bow, e.g., a concave or convex configuration, or (2) a ripple effect has been observed. Both deformations are not desirable. The former limits automated handling and affects yield during mechanical processing of DI substrates, while the latter substantially decreases yield due to stress-induced defects. For example, the growth of the polycrystalline silicon, exemplified by the addition of region, 10, from FIGS. 1E to 1F, has been reported to cause a substantial bow in the substrate, as shown in FIG. 2. (See T. Suzuki et al, *Journal of the Electrochemical Society*, 124, page 1776 (1977).) This bow has been ascribed to the substantial increase in the polycrystalline grain size resulting from the growth procedure. Ripple deformation, as exemplified in FIG. 3, has been observed when the configuration shown in FIG. 1G is subjected to an oxidizing atmosphere to produce device gate oxides in active region, 12.

To cure the defects associated with ripple deformations, the polycrystalline region, 16, of the substrate has been capped with a silicon nitride layer before formation of silicon oxide regions. (See U.S. Pat. No. 4,017,341, by T. Suzuki et al, issued Apr. 12, 1977, for a description of this procedure.) Capping with silicon nitride has, in fact, substantially reduced deformations of the FIG. 3 type but increases the bow deformation such as shown in FIG. 2. Additionally, use of a silicon nitride step requires both the deposition of silicon nitride and the ultimate removal of this layer to allow formation of electrical and thermal contacts.

SUMMARY OF THE INVENTION

Ripple deformations are avoided and a somewhat decreased bow obtained through a specific treatment step utilized in dielectrically isolated device formation. This step requires the heating of the substrate having small grain polycrystalline silicon regions to a temperature sufficient to substantially enlarge the median surface grain size. A suitable combination of temperature and treatment time required for this increase depends on the crystallographic texture, film strain, dopant concentration, if any, and size of the polycrystalline grains before the heat treatment. Exemplary of transformable material is a polycrystalline region formed by initial chemical vapor deposition (CVD) with SiHCl$_3$ at 1200 degrees C. followed by deposition with SiHCl$_3$ at 1150 degrees C. This material undergoes suitable enlargement of the median grain size from approximately 1 $\mu$m to greater than 10 $\mu$m, with a temperature/time combination generally of about 1410 degrees C. for about 1 minute. For most methods of forming polycrystalline silicon, temperatures of at least 1300 degrees C. are required to produce a substantial increase in polycrystalline grain size with a concomitant decrease in ripple deformation. Additionally, despite the increase in grain size, the bow of the polycrystalline silicon-containing substrate, in contrast to the reports of Suzuki, does not increase and, in fact, the substrate becomes less bowed, i.e., the substrate radius of curvature increases. Thus, contrary to previous reports, an increase in the grain size of a polycrystalline region by a specific technique allows a measurable decrease in bow, together with the substantial prevention of substrate rippling.

The desired procedure in one advantageous embodiment is accomplished by radiantly heating the substrate with electromagnetic radiation utilizing, for example, a tungsten halogen light source. Sufficient increase in the polycrystalline grain size is achieved in times as short as 1 minute. Thus, the extremely desirable results of increased yield associated with the inventive process are achievable with a minimal increase in processing procedures.

BRIEF DESCRIPTION OF THE DRAWING

FIG. 1 is illustrative of a procedure in the literature for processing substrates;

FIGS. 2 and 3 are illustrative of substrate configurations obtainable during processing; and FIGS. 4–6 are illustrative of conditions involved in the inventive procedure.

DETAILED DESCRIPTION

The ripple effect associated with the formation of silicon oxide areas in the presence of a substrate having a region of small or very small grain polycrystalline silicon is avoided by a heat treatment employed to enhance polycrystalline silicon surface grain size. (For purposes of this invention, a very small grain region and a small grain region are ones having a median grain size of less than, respectively, 4 $\mu$m and 10 $\mu$m at the surface of the polycrystalline region most remote from the device active region. A ripple conformation is the presence of more than one local extremum at points other than at the substrate periphery in at least one cross section of the substrate surface made by an imaginary plane perpendicular to the major surface of the substrate where the largest elevation difference between these extrema in the cross section is more than 25 $\mu$m.) It has been found, for polycrystalline silicon regions formed by most methods, that heating to a temperature above 1300 degrees C. produces the desired growth in crystal grain size. The heating step is performed after the polycrystalline silicon region is formed but before the oxide regions on the device active region are produced. A variety of techniques is available for producing the desired heating. Irrespective of the heat source employed, the polycrystalline region should be heated to the desired temperature and maintained at this temperature until the median polycrystalline grain size at the surface of the polycrystalline region furthest from the device active region is at least 10 $\mu$m. For example, the heating technique discussed in the context of solar cells, as disclosed by Ouwens and Heijligers, *Applied Physics Letters*, 26, page 569 (1975), is useful. For such convective and conductive heating techniques, a temperature generally in the range 1200 to 1370 degrees C. for a time period in the range 30 minutes to 10 hours is required to yield the desired grain enlargement. Although temperatures above 1370 degrees C., produced by conduction or convection, are not precluded, conduction or convection heating techniques lead to control and contamination difficulties. These difficulties are avoided by heating with electromagnetic radiation in the wavelength range 0.2 $\mu$m to 20 $\mu$m, with the radiation incident primarily on only one side of the substrate. (Radiant heating on both sides is not precluded but does not generally completely eliminate the difficulties associated with other heating mechanisms.) For heating induced by incident electromagnetic radiation, generally time periods in the range 5 to 60 minutes for temperatures in the range 1410 to 1365 degrees C., respectively, are required. (Use of particle beams, e.g., electron beams, vacuum ultraviolet light, or X-rays, is not precluded but is performed in vacuo and thus is less convenient. Additionally, use of microwave radiation is not precluded.)

Typically, advantageous crystal growth is obtained by a relatively uniform increase in substrate temperature to a level higher than 1300 degrees C., preferably higher than 1400 degrees C., and most preferably to a temperature of 1410 degrees C. (In a relatively uniform heating increase, the root mean square deviation of temperature across the substrate surface should not be more than 10 percent.) Typically, temperature increase rates in the range 10 to 20 degrees C. per second yield good results. Although temperatures above 1300 degrees C. are generally adequate for producing the desired result, typically the higher the temperature, the faster this result is achieved. Substantial melting of the polycrystalline silicon region, i.e., melting to a depth in the polycrystalline region of more than 20 percent of the total polycrystalline silicon layer thickness, should be avoided. However, temperatures essentially equivalent to the melting temperature of silicon are acceptable, are employable without causing unacceptable melting, and, in fact, are advantageous. In the context of conduction or convection heating, once the melting temperature is reached, melting propagates rapidly through the polycrystalline silicon region. Thus, it is advantageous for these heating methods to maintain the temperature just below the melting point. For radiant heating, temperatures slightly above the melting point are employable, and the melt depth criterion is still not exceeded. Such temperatures are achieved by gradually increasing the temperature provided by electromagnetic radiation until surface melting is initiated. As reported by G. K. Celler et al in *Applied Physics Letters*, 43, page 868 (1983), by this procedure, temperatures equivalent to or above the melting temperature of silicon are achievable without producing a substantial molten region. Typically, the limitation on molten region propagation is achieved in radiant heating by increasing the incident power density to a level generally no greater than 20 percent above the melting threshold.

After the appropriate heat treatment, the silicon oxide structures in the device active regions are produced by conventional techniques such as those described in *VLSI Technology*, edited by S. Sze, Chapter 11 by L. C. Parrillo, McGraw-Hill, 1983, pages 445–505. The device is then also completed by conventional techniques such as those described in Sze supra. For high voltage devices, the fabrication procedures are the same, and exemplary device configurations are described by Ballantyne et al, *Bell Laboratories Record*, April 1982, pages 91–94.

The following examples are illustrative of the invention.

EXAMPLE 1

A silicon substrate having silicon dioxide coated V-grooves was utilized. This silicon substrate was 100 mm in diameter, had a 200 ohm-cm resistivity, was p-type, had its major surface in the {100} crystallographic orientation, and was produced by the float zone method. The silicon substrate was grooved utilizing a preferential crystallographic etchant. This etchant was prepared by first dissolving 1648 grams of the KOH in 3630 ml of water and subsequently adding 485 ml of isopropyl alcohol to the aqueous KOH solution. The mixture was heated to approximately 80 degrees C. (The isopropyl alcohol was not totally soluble in the aqueous solution even at 80 degrees C., and therefore a portion of the added alcohol formed a separate phase which floated on the aqueous portion. Prior to each etch, the volume of the alcohol layer should be visually checked to ensure that an excessive quantity has not separated.) The substrate was prepared for treatment in this mixture by first immersing it for approximately 30 seconds in a mixture of 1 part HF and 15 parts water.

The substrate was masked with a silicon oxide pattern produced by first introducing the substrate into a furnace which had been heated to 1050 degrees C. An oxidizing atmosphere was produced in the furnace by bubbling oxygen through a bubbler heated to 98 degrees C. and introducing into the furnace the oxygen which was thus saturated with water vapor. The treatment of the substrate with oxygen was continued for 80 minutes to produce a 0.5 $\mu$m thick silicon oxide layer.

A 1 $\mu$m thick layer of AZ 111 positive resist (a proprietary product of Shipley Company) was spun onto the silicon oxide layer. The resist was exposed with a mercury lamp through a mask which contacted the resist surface. The mask consisted of a series of transparent rectangles of varying sizes which were separated by spaces varying between 50 and 500 $\mu$m. The resist was developed in a commercial resist developer. The exposed oxide regions were then etched away by immersing the substrate in a buffered aqueous solution of HF for 30 minutes. The resist was then removed by utilizing a commercial resist stripper, and the substrate was cleaned utilizing a hydrogen peroxide/sulfuric acid treatment with an associated rinse and drying step. The substrate was then rinsed in deionized water for approximately 2 minutes and immediately immersed in the water/KOH/alcohol mixture. The substrate in the mixture underwent an etching which proceeded at a rate of slightly over 1 $\mu$m per minute in a direction normal to the major surface of the substrate. Since an etch depth of 60 $\mu$m was desired, the substrate was maintained in the mixture for slightly less than 1 hour and then removed. The substrate was again rinsed for approximately 2 minutes in deionized water and spun dry in an atmosphere of heated dry nitrogen. The etch followed crystallographic planes and produced a V-shaped cavity having side walls oriented in the {111} plane. The grooves thus produced were bound by {111} planes and had their long axis along the [110] direction. The grooves were spaced at distances varying between 50 and 500 $\mu$m and had depths of approximately 60 $\mu$m.

The silicon dioxide coatings on the V-grooves were approximately 3.75 $\mu$m in thickness. The coatings were formed by introducing the substrate into a furnace heated to 1240 degrees C. The atmosphere of the furnace was produced by bubbling oxygen through a water bubbler heated to 98 degrees C. and introducing into the furnace the oxygen which was thus saturated with water vapor. The treatment of the substrate with oxygen was continued for 22 hours to produce a 3.75 $\mu$m thick layer of silicon dioxide.

The substrate was transferred to the sample holder of an AMV-1200 CVD reactor sold by Applied Materials, Inc. The substrate was positioned with the V-grooved surface exposed. The system was purged with dry nitrogen and then with dry hydrogen. The substrate was heated to 1200 degrees C. in dry halogen. The hydrogen flow was adjusted to give a flow rate of 95 liters per minute. A flow of trichlorosilane at a rate of 18 grams per minute was mixed with a 6 liters per minute flow of hydrogen, combined with the 95 liters per minute hydrogen flow, and continued for approximately 10 minutes, producing approximately 27 $\mu$m of silicon growth. The trichlorosilane flow was increased to a flow of 37 grams per minute. The temperature was reduced to 1150 degrees C. The trichlorosilane flow was continued for approximately 2 hours and 23 minutes to produce a total deposited polycrystalline silicon thickness of 739 $\mu$m. The trichlorosilane flow was then terminated. The deposition chamber was purged with dry hydrogen for 1 minute, the heating was terminated, and the substrate was allowed to cool in the dry hydrogen atmosphere.

The polycrystalline silicon material was cleaned, rinsed, and dried by immersion for approximately 30 seconds in a mixture of 1 part HF and 15 parts water, rinsed in deionized water for 2 minutes, and dried in dry nitrogen.

The substrate was then transferred to the sample holder of a radiant heat furnace. This furnace consisted of two chambers separated from each other and sealed by quartz plates. The substrate was positioned on three quartz pins in the lower chamber, about 0.5 inches above a water-cooled blackened aluminum oven floor. The upper chamber contained a bank of tungsten-halogen lamps suspended below a gold-plated reflector. Both chambers had lateral dimensions of 10$\times$12.5 inches. To avoid lamp overheating and early failure, air was forced through the fully enclosed upper chamber, which is essentially a wind tunnel with a quartz lower wall. Three phase-angle fired power supplies controlled by a microprocessor provided power to the lamps. After the substrate was inserted with the capping layer facing the lamps, the furnace was closed, the air cooling of the lamps begun, and the water cooling of the oven floor initiated. An air ambient was used in the sample chamber.

The temperature was increased by steps. Heating of 0.5 percent of the full radiant power of the oven, i.e., 0.5 percent of approximately 150 kW, was initially employed, and each step was produced by adding another 0.5 percent of full power to the level of radiant heating of the last step. After each step, the temperature was detected utilizing an optical pyrometer. The temperature increment, as measured by the pyrometer between two chronologically adjacent steps, was compared to the temperature increment of the two chronological previous steps. Thus, the increment shown by A in FIG. 4 is compared to the increment shown by B in FIG. 4. When A is less than or equal to one-fifth B, melting is initiated and the power is no longer increased but maintained at the level of the final step. After 5 minutes of treatment at this final temperature, the median grain size was approximately 30 $\mu$m. The difference in height between the edges and the center of the substrate changed from 23 mils to 12 mils upon subjecting the substrate to the heat treatment.

EXAMPLE 2

The procedure of Example 1 was followed except the polycrystalline silicon layer was produced by a cycling technique that yielded the grain structure labeled Example 2 in FIG. 5, as opposed to the grain structure used in Example 1 and pictorially represented in FIG. 5. The effect of final temperature on median surface grain radius is shown in FIG. 6. (Surface grain radius is the distance across the grain measured parallel to the surface at the surface.) Through this heat treatment and the concomitant increase in grain size, ripple was essentially totally avoided.

What is claimed is:

1. A process for fabricating a dielectrically isolated device comprising the steps of (1) forming a polycrystalline silicon region on a silicon substrate containing a single crystal silicon region and a silicon oxide region with said silicon oxide region interposed between said polycrystalline region and said single crystal region; (2) heating said substrate for a time and at a temperature sufficient to produce a mean surface grain size of said polycrystalline silicon region of at least 10 $\mu$m; and (3) forming a device in said single crystal silicon region.

2. The process of claim 1 wherein said heating is provided by conduction.

3. The process of claim 1 wherein said heating is provided radiantly.

4. The process of claim 3 wherein said radiant heating raises the temperature of said polycrystalline silicon region to at least 1300 degrees C.

5. The process of claim 4 wherein said polycrystalline silicon region temperature is raised to at least 1410 degrees C.

6. The process of claim 1 wherein said heating is provided by convection.

* * * * *